United States Patent
Yin et al.

(10) Patent No.: US 11,073,877 B2
(45) Date of Patent: Jul. 27, 2021

(54) IN-VEHICLE COMPUTING APPARATUS IN INTELLIGENT VEHICLE AND INTELLIGENT VEHICLE

(71) Applicant: Huawei Technologies Co., Ltd., Shenzhen (CN)

(72) Inventors: Jianqiang Yin, Dongguan (CN); Zhenming Hu, Hangzhou (CN); Yonghai Mao, Shenzhen (CN); Xiaofei Li, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/989,174

(22) Filed: Aug. 10, 2020

(65) Prior Publication Data
US 2021/0011534 A1 Jan. 14, 2021

Related U.S. Application Data

(63) Continuation of application No. PCT/CN2019/095873, filed on Jul. 12, 2019.

(51) Int. Cl.
*G06F 1/20* (2006.01)
*H05K 7/20* (2006.01)

(52) U.S. Cl.
CPC ........... *G06F 1/20* (2013.01); *H05K 7/20172* (2013.01); *H05K 7/20318* (2013.01); *H05K 7/20409* (2013.01); *G06F 2200/201* (2013.01)

(58) Field of Classification Search
CPC . G06F 1/20; G06F 2200/201; H05K 7/20318; H05K 7/20409; H05K 7/20172;
(Continued)

(56) References Cited

U.S. PATENT DOCUMENTS

| 7,236,361 B2 * | 6/2007 | Cote | G11B 33/127 165/80.3 |
| 7,564,685 B2 * | 7/2009 | Clidaras | G06F 1/206 165/80.4 |

(Continued)

FOREIGN PATENT DOCUMENTS

| CN | 102436295 A | 5/2012 |
| CN | 102956586 A | 3/2013 |

(Continued)

OTHER PUBLICATIONS

Masuko Koichi; Matsuda Masamune, "Both-Sided Mounting Cooling-Plate", Sep. 22, 2014, Fujikura LTD, Entire Document (Translation of JP 2014175539) (Year: 2014).*

(Continued)

*Primary Examiner* — Stephen S Sul (74) *Attorney, Agent, or Firm* — Conley Rose, P.C.

(57) ABSTRACT

An in-vehicle computing apparatus in an intelligent vehicle and an intelligent vehicle, where the in-vehicle computing apparatus includes two stacked mainboards, and a radiator that is disposed between the two mainboards and configured to dissipate heat for the two mainboards, and a sealing plate connected to the radiator and disposed on a side that is of each mainboard and that is away from the radiator, where each sealing plate and the radiator seal a corresponding mainboard between the sealing plate and the radiator.

12 Claims, 9 Drawing Sheets

(58) Field of Classification Search
CPC . H05K 1/0201–0203; H05K 2201/066; H05K 7/20136–20163; H05K 7/20863
USPC .............. 361/679.47, 679.48, 679.54, 690, 361/691–692, 694–696, 721
See application file for complete search history.

(56) References Cited

U.S. PATENT DOCUMENTS

| | | | |
|---|---|---|---|
| 7,675,747 B1* | 3/2010 | Ong | F04D 19/024 361/679.48 |
| 9,173,326 B1* | 10/2015 | Smith | H05K 7/20727 |
| 9,265,175 B2* | 2/2016 | Yoshida | H05K 7/20727 |
| 10,085,361 B2* | 9/2018 | Lin | H05K 1/148 |
| 10,624,234 B2* | 4/2020 | Saido | H05K 7/20163 |
| 10,645,848 B1* | 5/2020 | Lu | G01S 13/931 |
| 2003/0198016 A1* | 10/2003 | Wobig | G06F 1/20 361/679.47 |
| 2008/0037218 A1* | 2/2008 | Sharma | H05K 7/1424 361/695 |
| 2008/0158818 A1* | 7/2008 | Clidaras | H05K 7/20772 361/699 |
| 2009/0097202 A1* | 4/2009 | Gipson | B01D 46/0067 361/695 |
| 2009/0195979 A1* | 8/2009 | Ji | H05K 7/20727 361/679.48 |
| 2010/0091458 A1* | 4/2010 | Mosier, Jr. | H05K 7/20572 361/695 |
| 2012/0219413 A1* | 8/2012 | Charest | F04D 29/601 415/213.1 |
| 2013/0050944 A1 | 2/2013 | Shepard | |
| 2013/0100613 A1* | 4/2013 | Nakai | H05K 7/20136 361/695 |
| 2014/0313666 A1* | 10/2014 | Chin | H05K 7/20972 361/692 |
| 2014/0362521 A1* | 12/2014 | Pronozuk | G11B 33/142 361/679.47 |
| 2015/0189795 A1 | 7/2015 | Liu et al. | |
| 2015/0289413 A1* | 10/2015 | Rush | H05K 7/20672 361/700 |
| 2015/0327402 A1* | 11/2015 | Slippey | H05K 7/20318 361/714 |
| 2017/0064865 A1* | 3/2017 | Kuwahara | H05K 7/20154 |
| 2018/0224909 A1* | 8/2018 | Koo | G06F 1/1632 |
| 2018/0270986 A1* | 9/2018 | Zaindl | B60R 16/0231 |
| 2019/0289752 A1* | 9/2019 | Ma | H05K 7/20154 |
| 2019/0320555 A1* | 10/2019 | Flavin | H05K 5/069 |
| 2019/0335621 A1* | 10/2019 | Szostek | H05K 7/20863 |
| 2020/0023513 A1* | 1/2020 | Ha | B25J 5/007 |
| 2020/0164297 A1* | 5/2020 | Liao | B01D 46/0004 |

FOREIGN PATENT DOCUMENTS

| | | | |
|---|---|---|---|
| CN | 104765432 A | | 7/2015 |
| CN | 109552303 A | | 4/2019 |
| CN | 109733461 A | * | 5/2019 |
| CN | 109733461 A | | 5/2019 |
| JP | 2014175539 A | * | 9/2014 |
| JP | 2014175539 A | | 9/2014 |

OTHER PUBLICATIONS

Ding Ke; He Jugang; Kong Zhouwei; Liang Fenghua; Wang Jianqiang; Zhour Zengbi, "Redundant electronic steering system and control method of autonomous vehicle", May 10, 2019, Chongqing Changan Automobile Co Ltd, Entire Document (Translation of CN 109733461) (Year: 2019).*

* cited by examiner

IN-VEHICLE COMPUTING APPARATUS IN INTELLIGENT VEHICLE AND INTELLIGENT VEHICLE

CROSS-REFERENCE TO RELATED APPLICATIONS

This application is a continuation of International Patent Application No. PCT/CN2019/095873 filed on Jul. 12, 2019, which is hereby incorporated by reference in its entirety.

TECHNICAL FIELD

This application relates to the field of intelligent vehicle technologies, and in particular, to an in-vehicle computing apparatus in an intelligent vehicle and an intelligent vehicle.

BACKGROUND

Automated driving is a key technology for implementing an intelligent vehicle and intelligent transportation, and is also an inevitable trend of future intelligent vehicle development. With continuous increase in an intelligent driving level, there is a growing requirement for a computing capability of an in-vehicle computing apparatus, and a heat dissipation apparatus of the in-vehicle computing apparatus faces an increasing challenge. For example, a heat dissipation requirement is increased from at least 20 watts (W) to more than 200 W. However, a conventional in-vehicle computing apparatus dissipates heat with natural wind, and this cannot meet a heat dissipation requirement of the in-vehicle computing apparatus in the intelligent vehicle. In addition, as a driving level of automated driving increases, a 1+1 redundancy design needs to be physically implemented on the in-vehicle computing apparatus. To be specific, two in-vehicle computing apparatuses need to be disposed, and each in-vehicle computing apparatus needs to use an independent heat dissipation apparatus to dissipate heat of the in-vehicle computing apparatus. In a conventional design, two in-vehicle computing apparatuses are disposed at a front end and a rear end of an intelligent vehicle body, and each are equipped with one heat dissipation apparatus. The in-vehicle computing apparatus is large in size and occupies much space inside the vehicle. Therefore, how to provide an in-vehicle computing apparatus with a small size and good heat dissipation in an intelligent driving vehicle becomes a technical problem that needs to be urgently resolved.

SUMMARY

This application provides an in-vehicle computing apparatus in an intelligent vehicle and an intelligent vehicle, to reduce a volume of the computing apparatus in the intelligent vehicle and improve a heat dissipation capability of the computing apparatus in the intelligent vehicle.

According to a first aspect, an in-vehicle computing apparatus in an intelligent vehicle is provided, where the in-vehicle computing apparatus includes two stacked mainboards, each mainboard includes a plurality of components, the plurality of components are configured to perform driving status control and status monitoring on the intelligent vehicle, and the two mainboards are used as a 1+1 redundancy design. The in-vehicle computing apparatus further includes a radiator that is disposed between the two mainboards and connected to each mainboard in a thermally conductive manner, and the radiator is used as a shared radiator of the two mainboards. In addition, the in-vehicle computing apparatus further includes a sealing plate connected to the radiator and disposed on a side that is of each mainboard and that is away from the radiator. Each sealing plate and the radiator seal a corresponding mainboard between the sealing plate and the radiator. In the foregoing technical solution, two mainboards are designed in the in-vehicle computing apparatus, and heat on the two mainboards is dissipated through a shared radiator. An effect of two in-vehicle computing apparatuses in the other approaches is achieved by a volume of approximately one in-vehicle computing apparatus in the other approaches. Therefore, a redundancy design of the vehicle is met, a space area occupied by the in-vehicle computing apparatus is reduced, and in addition, the mainboard is sealed with the sealing plate and the radiator, a waterproof effect of the mainboard is improved.

In a possible implementable solution, the radiator includes a housing, a heat dissipation channel disposed on the housing, and an air supply module, where the air supply module includes a first fan module and a second fan module that are arranged along a length direction of the heat dissipation channel, and the first fan module and the second fan module have a same air supply direction. Air outside the radiator is blown into the heat dissipation channel using the first fan module, and air inside the heat dissipation channel is exhausted using the second fan module, thereby improving fluidity inside the heat dissipation channel, and further improving a heat dissipation effect of the radiator.

In another possible implementable solution, the intelligent vehicle includes an in-vehicle power supply system, and the in-vehicle power supply system supplies power to the first fan module or the second fan module through at least one of the two mainboards, and the first fan module is electrically connected to one of the two mainboards, and the second fan module is electrically connected to the other mainboard in the two mainboards, or the first fan module is electrically connected to the two mainboards, and the second fan module is electrically connected to the two mainboards. The first fan module and the second fan module are each connected to the two mainboards, and the power supply system may supply power to the first fan module and the second fan module using at least one mainboard, thereby ensuring that at least one fan module is in a working state, improving reliability of an air-cooling radiator, and also improving reliability of the in-vehicle computing apparatus.

In another possible implementable solution, the first fan module and the second fan module are each detachably and fixedly connected to the housing. Each fan module can be detachably connected to the housing such that when a fan module is faulty, the fan module can be disassembled for repair or replacement.

In another possible implementable solution, a first jack and a second jack are disposed on the housing, the first fan module is detachably fastened to the first jack, and the second fan module is detachably fastened to the second jack. Installation of the fan module is facilitated through cooperation of the jack and the fan module.

In another possible implementable solution, the first fan module and the second fan module are directly fastened to an air inlet and an air outlet of the heat dissipation channel in a snap-fit manner. The fan module is directly fastened to the housing in a snap-fit manner such that installation and maintenance of the fan module are facilitated.

In another possible implementable solution, a plurality of heat dissipation fins is disposed inside the housing, and the heat dissipation channel is formed between the plurality of heat dissipation fins. When air flows inside the heat dissipation channel, heat on the heat dissipation fins is taken away, thereby improving a heat exchanging effect.

In another possible implementable solution, the first fan module and the second fan module each include a bracket, at least one mounting hole disposed on the bracket, and a fan fastened inside each mounting hole with a connecting piece. The fan is detachably connected to the bracket such that when the fan is faulty, it is convenient to disassemble and maintain the fan.

In another possible implementable solution, the heat dissipation channel is a straight channel, and a length direction of the heat dissipation channel is perpendicular to a stacking direction of the two mainboards. When a straight heat dissipation channel is used, air can directly flow from the air inlet to the air outlet, and the air is not blocked in a flowing process, thereby improving air fluidity, and further improving a heat dissipation effect of the radiator.

In another possible implementable solution, the first fan module blows air outside the radiator into the heat dissipation channel, and the second fan module draws air inside the heat dissipation channel out of the radiator. Air is drawn into the heat dissipation channel using the first fan module, and the air inside the heat dissipation channel is drawn out of the radiator using the second fan module, thereby improving air fluidity inside the heat dissipation channel, improving heat dissipation effects of the air and the heat dissipation fins, and further improving heat dissipation efficiency of the radiator.

In another possible implementable solution, the radiator is a liquid-cooling radiator. A liquid medium is used to dissipate heat for the mainboard, thereby improving a heat dissipation effect for the mainboard.

In another possible implementable solution, the intelligent vehicle includes a cooling system, and the cooling system is configured to control the liquid-cooling radiator. The liquid-cooling radiator includes a housing and a heat dissipation pipe disposed inside the housing, and a water inlet pipe and a water outlet pipe that are connected to the heat dissipation pipe are disposed on the housing. Two opposite surfaces of the housing are one-to-one connected to the two mainboards in a thermally conductive manner. The heat dissipation pipe carries the liquid medium to dissipate heat for the mainboard.

In another possible implementable solution, a plurality of first heat dissipation fins arranged at intervals are disposed inside the housing, and a connected S-shaped heat dissipation pipe is formed between the plurality of first heat dissipation fins. The S-shaped heat dissipation pipe increases fluidity of the liquid medium inside the housing, and improves a heat dissipation effect of the radiator.

In another possible implementable solution, a plurality of second heat dissipation fins are disposed between any adjacent first heat dissipation fins, and the plurality of second heat dissipation fins are arranged at intervals. Heat transferred to the housing is transferred to the second heat dissipation fins. A contact area with the liquid medium is increased due to the disposed second heat dissipation fins, thereby improving a heat dissipation effect of the liquid medium.

In another possible implementable solution, the cooling system is configured to pump the liquid medium into the heat dissipation pipe, and the liquid medium dissipates heat for the two chips in the heat dissipation pipe. The cooling system provides flowing power of the liquid medium.

In another possible implementable solution, when the heat dissipation pipe is formed with the plurality of first heat dissipation fins, a volume of a liquid medium that is pumped by the cooling system into the heat dissipation pipe at a single time is greater than or equal to a volume of a liquid medium that is accommodated between two adjacent first fins. A specific amount of liquid medium is pumped such that fluidity of the liquid medium inside the heat dissipation pipe is ensured.

In another possible implementable solution, each mainboard has a first surface facing the radiator, at least one first functional component is disposed on the first surface, and the at least one first functional component is connected to the radiator in a thermally conductive manner. The first functional component is a component with relatively high power among components on the mainboard. The first functional component is in direct contact with the radiator such that heat emitted by the first functional component may be directly taken away by the radiator, thereby improving a heat dissipation effect achieved by the radiator for the mainboard.

In another possible implementable solution, each mainboard has a second surface away from the radiator, and at least one second functional component is disposed on the second surface. A sealing plate corresponding to each mainboard is a heat dissipation plate, and each second functional component of each mainboard is connected to the heat dissipation plate in a thermally conductive manner. The second functional component is a component with relatively low power among components on the mainboard. The sealing plate is used as a heat dissipation plate, and the heat dissipation plate is connected to the radiator in a thermally conductive manner. Heat generated by the second functional component is transferred by the heat dissipation plate to the radiator for emission, thereby further improving a heat dissipation effect of the mainboard.

According to a second aspect, an intelligent vehicle is provided. The intelligent vehicle includes an intelligent vehicle body, and the foregoing in-vehicle computing apparatus disposed inside the intelligent vehicle body of the intelligent vehicle. In the foregoing technical solution, two mainboards are designed in the in-vehicle computing apparatus, and heat on the two mainboards is dissipated through a shared radiator. An effect of two in-vehicle computing apparatuses in the other approaches is achieved by a volume of approximately one in-vehicle computing apparatus in the other approaches. Therefore, a redundancy design of the vehicle is met, and a space area occupied by the in-vehicle computing apparatus is reduced.

In another possible implementable solution, the in-vehicle computing apparatus is disposed on one end of the intelligent vehicle body. The in-vehicle computing apparatus may be disposed at different positions inside the intelligent vehicle body based on requirements.

In another possible implementable solution, the intelligent vehicle further includes a cooling system disposed inside the intelligent vehicle body, and the cooling system includes a condenser, a cooling plate connected to the condenser through a pipe, and the radiator, where the radiator is a liquid-cooling radiator. The cooling system inside the vehicle is used to dissipate heat for the in-vehicle computing apparatus.

In another possible implementable solution, the cooling system further includes a liquid pump (such as a water pump) disposed on the pipe, thereby improving a heat dissipation effect.

In this application, based on the implementations provided in the foregoing aspects, the implementations may be further combined to provide more implementations.

Reference numerals 10: Air-cooling radiator, 11: Housing, 111: Protrusion, 12: Heat dissipation fin, 121: Bending structure, 13: Heat dissipation channel, 14: Top wall, 15: Bottom wall, 20: First sealing plate, 30: Second sealing plate, 40: First mainboard, 41: First functional component, 42: First surface, 43: Second surface, 44: Second functional component, 50: Second mainboard, 60: Air supply module, 61: First fan module, 62: Second fan module, 63: Cable, 64: Bracket, 65: Mounting hole, 66: Connection terminal, 70: Liquid-cooling radiator, 71: Housing, 711: First side wall, 712: Second side wall, 72: Water outlet, 73: Water inlet, 74: Heat dissipation pipe, 75: First heat dissipation fin, 751: First heat dissipation fin, 752: First heat dissipation fin, 753: First heat dissipation fin, 754: First heat dissipation fin, 76: Second heat dissipation fin.

DESCRIPTION OF EMBODIMENTS

The following further describes the embodiments of this application with reference to the accompanying drawings.

An application scenario of an in-vehicle computing apparatus provided in the embodiments of this application is first described. The in-vehicle computing apparatus provided in the embodiments of this application is applied to automated driving of an intelligent vehicle, and includes an electric vehicle or a gasoline-driven vehicle that supports unmanned driving, advanced driver-assistance systems (ADAS), intelligent driving, connected driving, intelligent network driving, and car sharing. The in-vehicle computing apparatus is configured to perform driving status control and status monitoring on the intelligent vehicle, and includes but is not limited to an in-vehicle mobile data center (MDC), a hardware monitor interface (HMI) that implements a function of a human-computer interaction controller, an in-vehicle infotainment (IVI) controller, a vehicle body control module (BCM), and a vehicle control unit (VCU). The in-vehicle computing apparatus may be a chip having a computing and processing capability, or may be a set of a plurality of components such as a processor and a memory that are integrated into a printed circuit board (PCB). The processor includes but is not limited to a central processing unit (CPU), a general purpose processor, a digital signal processor (DSP), an application-specific integrated circuit (ASIC), a field-programmable gate array (FPGA) or another programmable logic device, a discrete gate or a transistor logic device, a discrete hardware component, a graphics processing unit (GPU), a system on chip (SoC), and an artificial intelligence (AI) chip. The general purpose processor may be a microprocessor or any conventional processor or the like.

The printed circuit board integrated with the foregoing processor is also referred to as a mainboard.

A specific structure of the in-vehicle computing apparatus provided in the embodiments of this application is described below with reference to the accompanying drawings.

Figure 1:
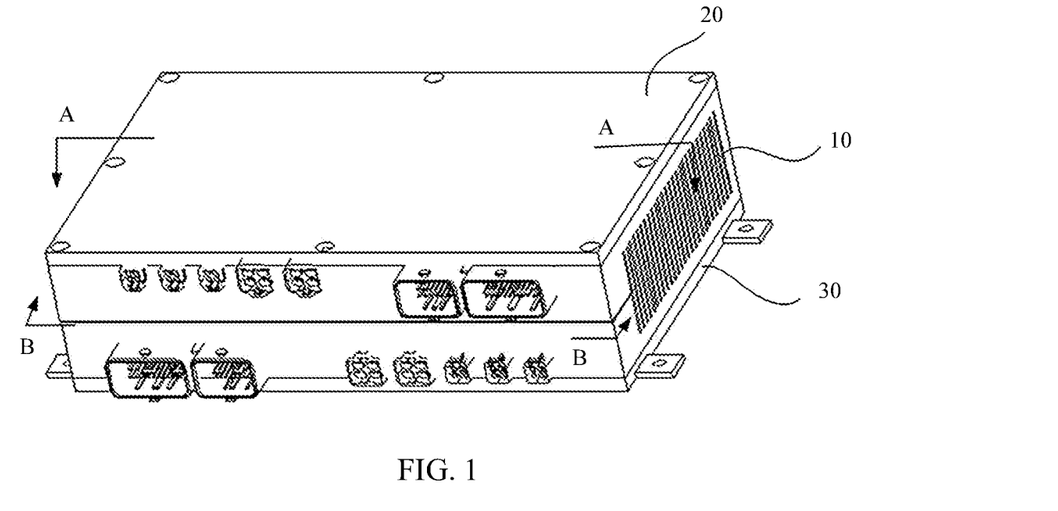
FIG. 1 is a schematic structural diagram of an in-vehicle computing apparatus in an intelligent vehicle according to this application.
Figure 2:
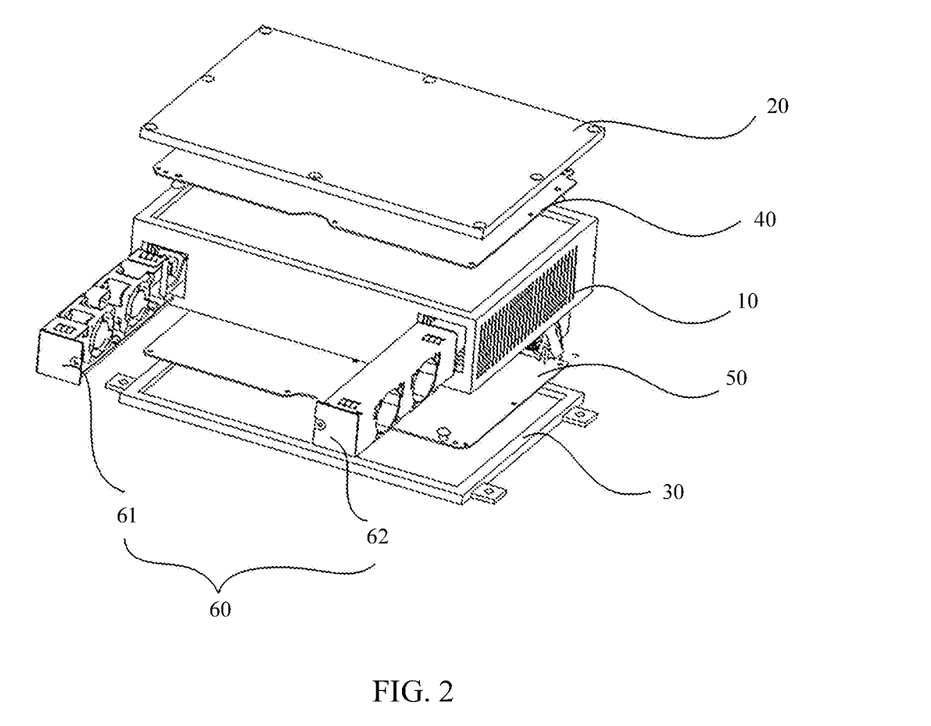
FIG. 2 is a schematic exploded diagram of an in-vehicle computing apparatus in an intelligent vehicle according to this application.
Figure 3A:
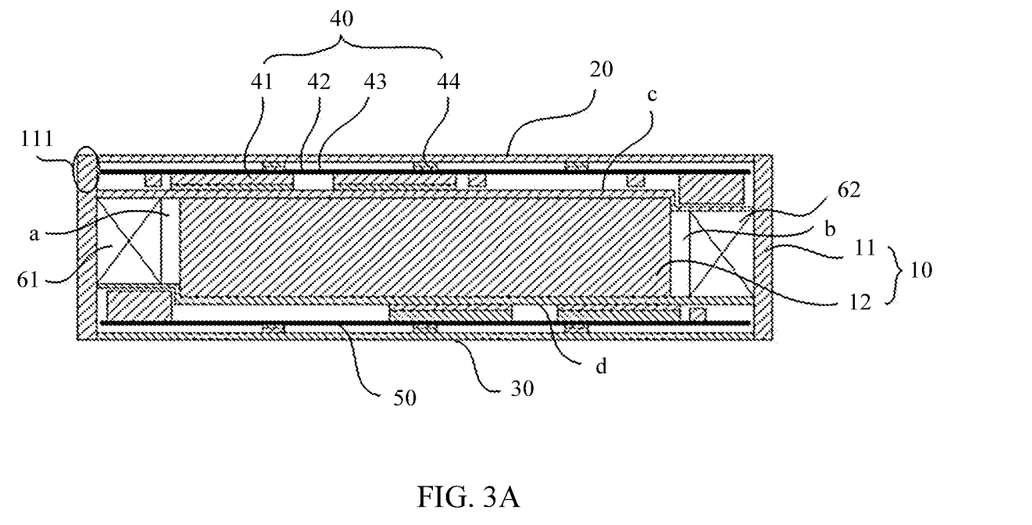
FIG. 3A is a sectional view at a position A-A in FIG. 1.

As shown in FIG. 1 and FIG. 2, FIG. 1 is a schematic structural diagram of an in-vehicle computing apparatus in an intelligent vehicle according to an embodiment of this application, and FIG. 2 is a schematic exploded diagram of a computing module in an intelligent vehicle according to an embodiment of this application. In-vehicle computing provided in this embodiment of this application includes two mainboards, each mainboard includes a plurality of components, and the plurality of components are configured to perform driving status control and status monitoring on the intelligent vehicle. For ease of description, the two mainboards are referred to as a first mainboard 40 and a second mainboard 50, and the first mainboard 40 and the second mainboard 50 are the same in terms of both structure and function. For specific arrangement of the first mainboard 40 and the second mainboard 50, refer to FIG. 3A at the same time. FIG. 3A is a sectional view at a position A-A in FIG. 1. The sectional view at the position A-A is a schematic sectional view of the in-vehicle computing apparatus shown in FIG. 1 along a vertical plane parallel to a stacking direction of the first mainboard 40 and the second mainboard 50. The first mainboard 40 and the second mainboard 50 each include a first surface 42 and a second surface 43 that are opposite to each other. At least one first functional component 41 is disposed on the first surface 42, and at least one second functional component 44 is disposed on the second surface 43. Power of the first functional component 41 is greater than power of the second functional component 44. In other words, a heat producing amount of the first functional component 41 is greater than a heat producing amount of the second functional component 44. Certainly, only the first functional component is disposed on the first surface 41, and no component is disposed on the second surface 42. When the first mainboard is connected to another device, a connection terminal configured to connect to another component is disposed on the first mainboard 40, and the connection terminal is electrically connected to the first functional component 41 and the second functional component 44. A manner of connecting the connection terminal to the first functional component 41 and the second functional component 44 may be a connection manner such as soldering, slotting, or surface mounting. The surface mounting is a surface mounting technology that includes applying soldering paste on a soldering pad of the mainboard, mounting a component to a corresponding position on a mainboard surface on which the soldering paste or adhesive is printed, and then re-fusing a paste soft soldering material pre-allocated to the soldering pad, to implement an electronic connection between the soldering pad and a soldering end or a pin of the component assembled on the surface.

Both the first mainboard 40 and the second mainboard 50 are configured to perform driving status control and status monitoring on the intelligent vehicle. During specific use, only one of the first mainboard 40 and the second mainboard 50 is in a working state, and the other mainboard is used as a backup mainboard, to implement a 1+1 redundancy design, thereby ensuring reliability of an entire automated driving system. Optionally, the two mainboards may also implement a data processing process in the intelligent vehicle together by sharing load, to accelerate a data processing speed.

Still refer to FIG. 1 and FIG. 2. The in-vehicle computing apparatus provided in this embodiment of this application further includes a radiator and two sealing plates, and the radiator is an air-cooling radiator 10. As shown in FIG. 2, the air-cooling radiator 10 is disposed between the first mainboard 40 and the second mainboard 50 to dissipate heat for the first mainboard 40 and the second mainboard 50, and the first mainboard 40 and the second mainboard 50 are respectively connected to the air-cooling radiator 10 in a thermally conductive manner. Each sealing plate is disposed on a side that is of the mainboard and that is away from the air-cooling radiator 10. For ease of description, the two sealing plates are referred to as a first sealing plate 20 and a second sealing plate 30, the first sealing plate 20 corresponds to the first mainboard 40, and the second sealing plate 30 corresponds to the second mainboard 50. Each sealing plate is connected to a corresponding mainboard in a same manner. Cooperation of the first sealing plate 20 and the first mainboard 40 is used as an example below to describe a manner of connecting the air-cooling radiator 10, the sealing plate, and the mainboard.

For ease of description, two opposite surfaces of the air-cooling radiator 10 are defined in FIG. 3A a third surface c and a fourth surface d. The third surface c faces the first mainboard 40, and the fourth surface d faces the second mainboard 50.

Still refer to FIG. 3A. The first mainboard 40 is fastened to the third surface c of the air-cooling radiator 10. Further, the first mainboard 40 may be fastened to the third surface c of the air-cooling radiator 10 with a threaded connecting piece (such as a bolt or a screw), and the first surface of the first mainboard 40 faces the air-cooling radiator 10. The first functional component 41 of the first mainboard 40 faces the air-cooling radiator 10 and is connected to the third surface c of the air-cooling radiator 10 in a thermally conductive manner with thermally conductive adhesive or another thermally conductive medium. When there are a plurality of first functional components 41 on the first mainboard 40, each first functional component 41 is connected to the third surface c of the air-cooling radiator 10 in a thermally conductive manner with thermally conductive adhesive or another thermally conductive medium. When heights of different first functional components 41 are different, a corresponding protrusion or groove (not shown in FIG. 3A) is disposed on the third surface c of the air-cooling radiator 10, to ensure that each first functional component 41 can be in full contact with the third surface c of the air-cooling radiator 10. During heat dissipation, heat generated by the first functional component 41 is transferred to the third surface c of the air-cooling radiator 10 through heat conducting adhesive or another thermally conductive medium, and the heat is dissipated through the air-cooling radiator 10.

Still refer to FIG. 3A. The first sealing plate 20 is fixedly connected to the air-cooling radiator 10, for example, the first sealing plate 20 is fastened to the third surface c of the air-cooling radiator 10 with a bolt or a screw. Refer to FIG. 2 and FIG. 3A. A ring-shaped protrusion 111 is disposed on a first surface of the air-cooling radiator 10, the first sealing plate 20 covers the protrusion 111 and forms, together with the protrusion 111, an accommodation cavity (not marked in the figure) for accommodating the first mainboard 40, and the first mainboard 40 is located inside the accommodation cavity. The air-cooling radiator 10, the first mainboard 40, and the first sealing plate 20 form a sandwich-type stacked structure.

During use, the first mainboard 40 needs to have a specific waterproof requirement. Therefore, the first sealing plate 20 and the air-cooling radiator 10 are connected in a sealing manner, to seal the first mainboard 40 inside the accommodation cavity enclosed by the first sealing plate 20 and the air-cooling radiator 10. During sealing, a connection terminal of the first mainboard 40 needs to be exposed outside the air-cooling radiator 10 to connect to another component. Therefore, the connection terminal is a connection terminal that reaches a specified waterproof level, and sealing and waterproof processing is also performed between the connection terminal and the air-cooling radiator 10. For example, the connection terminal and the air-cooling radiator 10 are sealed with a sealant or a sealing gasket.

Still refer to FIG. 3A. When the first mainboard is placed inside the accommodation cavity, the second surface 43 of the first mainboard 40 faces the first sealing plate 20. When the second functional component 44 is disposed on the second surface 42, heat generated by the second functional component 44 may be dissipated through the first sealing plate 20. In this case, a heat dissipation plate is used as the first sealing plate, and the second functional component 44 on the second surface 43 is connected to the first sealing plate 20 in a thermally conductive manner. For example, thermally conductive adhesive or another common thermally conductive material is padded between the second functional component 44 and the first sealing plate 20 to conduct heat. There are three second functional components 44 shown in FIG. 3A, but a quantity of second functional components 44 is not limited to a quantity shown in FIG. 3A, and another quantity of second functional components 44 may also be used, for example, different quantities such as one, two, or three. In addition, heights of different second functional components 44 may be the same or different. When heights of the second functional components 44 are different, a corresponding protrusion or depression structure (not shown in the figure) is further disposed on the second sealing plate 30, to ensure that the second functional component 44 can be in full contact with the second sealing plate 30.

When the first sealing plate 20 is used as a heat dissipation plate, the first sealing plate 20 is connected to the air-cooling radiator 10 in a thermally conductive manner. For example, thermally conductive adhesive or another common thermally conductive material is coated between the first sealing plate 20 and the protrusion 111 to implement a thermally conductive connection. During use, heat generated by the second functional component 44 is transferred to the second sealing plate 30, heat on the second sealing plate 30 is transferred to the air-cooling radiator 10 through the protrusion 111, and the heat is dissipated through the air-cooling radiator 10.

Optionally, the first mainboard 40 and the first sealing plate 20 may also be fixedly connected. If the first mainboard 40 is fixedly connected to the first sealing plate 20 with a buckle or a threaded connecting piece (such as a bolt or a screw), and then the first sealing plate 20 is fixedly connected to the air-cooling radiator 10, the first mainboard 40 can also be fastened inside the accommodation cavity.

A manner of disposing the second mainboard 50 is the same as a manner of disposing the first mainboard 40, and therefore, details are not described herein again.

Figure 3B:
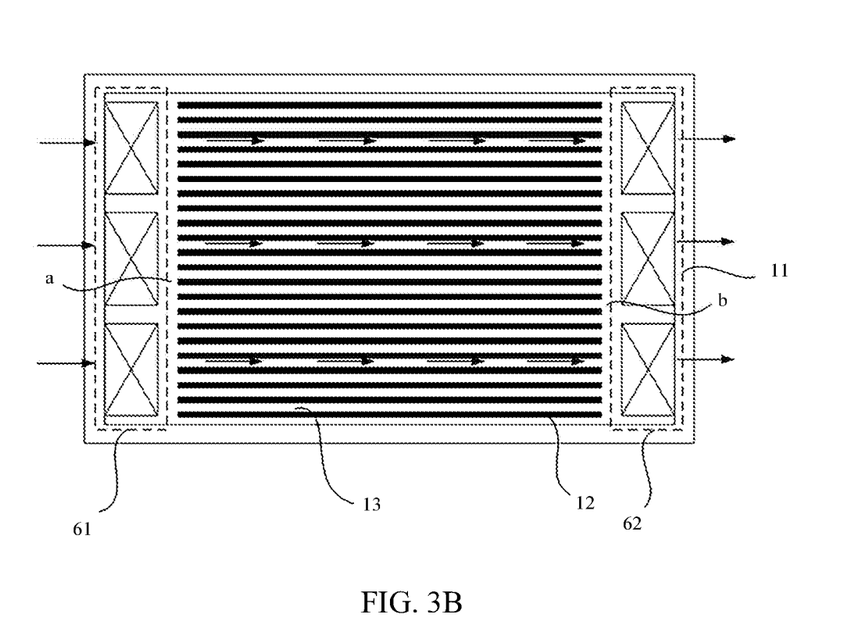
FIG. 3B is a sectional view at a position B-B in FIG. 1.

Refer to FIG. 2, FIG. 3A, and FIG. 3B. FIG. 3B is a sectional view at a position B-B, where the sectional view at the position B-B is a schematic sectional view of the in-vehicle computing apparatus along a horizontal plane perpendicular to a stacking direction of the first mainboard 20 and the second mainboard 30 in FIG. 1. First, refer to FIG. 2. The air-cooling radiator 10 includes a housing 11, and the housing 11 has four side walls (not marked in the figure) and a top wall and a bottom wall connected to the four side walls. The top wall has the foregoing third surface c, and the bottom wall has the foregoing fourth surface d. Refer to FIG. 3A and FIG. 3B. A heat dissipation channel 13 is disposed inside the housing 11, an air inlet a and an air outlet b that are connected to the heat dissipation channel 13 are disposed on two opposite side walls of the housing 11. Still refer to FIG. 3A and FIG. 3B. A plurality of heat dissipation fins 12 are disposed inside the housing 11, each heat dissipation fin 12 is a rectangular heat dissipation fin (or in another shape such as a rhombus or an oval), and a length direction of the heat dissipation fin 12 is along a direction from the air inlet a to the air outlet b. Each heat dissipation fin 12 is separately connected to the top wall and the bottom wall in a thermally conductive manner. Heat transferred by the first mainboard 40 and the second mainboard 50 to the air-cooling radiator 10 is transferred to the heat dissipation fin 12 through the housing 11 and dissipated.

Still refer to FIG. 3A and FIG. 3B. The plurality of heat dissipation fins 12 are disposed in a single row arrangement manner, and an arrangement direction of the plurality of heat dissipation fins 12 is perpendicular to the direction from the air inlet a to the air outlet b. For details, refer to FIG. 3B. During arrangement of the plurality of heat dissipation fins 12, there is a gap (not marked in the figure) between adjacent heat dissipation fins 12, and adjacent heat dissipation fins 12 in FIG. 3B are arranged at equal intervals, but an interval size between the heat dissipation fins 12 is not limited in this embodiment of this application, and an interval between the heat dissipation fins 12 may be set based on a requirement. Still refer to FIG. 3B. The plurality of heat dissipation fins 12 form the heat dissipation channel 13 of the air-cooling radiator 10. During heat dissipation, cold air flows from the air inlet a to the heat dissipation channel 13 and flows through the gap between the heat dissipation fins 12, and heat on the heat dissipation fin 12 is taken away through heat exchanging, and finally flows out through the air outlet b. The air inlet a and the air outlet b are disposed at opposite sides, and the heat dissipation channel is a straight channel, and therefore an airflow is not worn, thereby improving a heat dissipation effect.

Figure 4A:
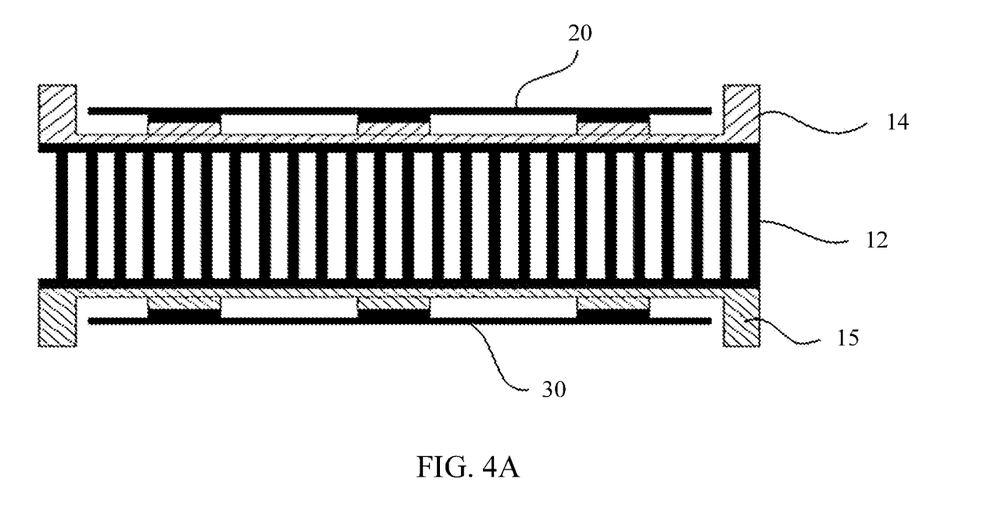
FIG. 4A is a specific schematic structural diagram of another air-cooling radiator according to this application.
Figure 4B:
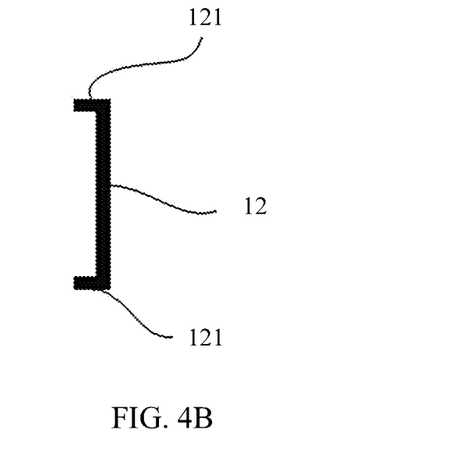
FIG. 4B is a schematic structural diagram of a heat dissipation fin according to this application.

As shown in FIG. 4A and FIG. 4B, FIG. 4A shows a specific structure of another air-cooling radiator. A housing 11 of an air-cooling radiator 10 includes only a top wall 14 and a bottom wall 15, and the top wall 14 and the bottom wall 15 are fixedly connected with a heat dissipation fin 12. Also referring to FIG. 4B, FIG. 4B shows a specific structure of the heat dissipation fin 12. A side that is of the heat dissipation fin 12 and that is connected to the top wall 14 and the bottom wall 15 has a bending structure 121, and the heat dissipation fin 12 is welded to the top wall 14 and the bottom wall 15 with the bending structure 121, or is fixedly connected to the top wall 14 and the bottom wall 15 with a rivet or a threaded connecting piece (such as a bolt or a screw). To improve the heat dissipation effect, a common thermally conductive medium such as thermally conductive adhesive may be coated between the bending structure 121 of the heat dissipation fin 12 and the top wall 14 or the bottom wall 15.

Figure 5:
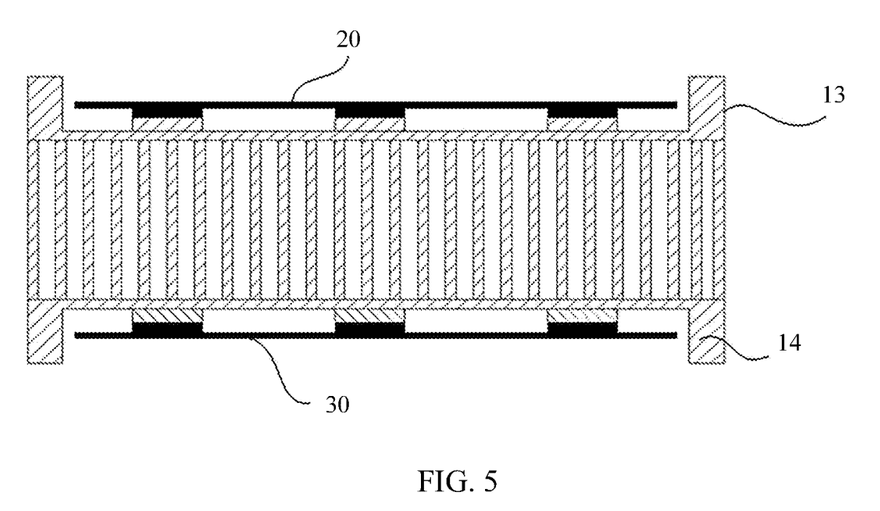
FIG. 5 is a schematic structural diagram of another air-cooling radiator according to this application.

As shown in FIG. 5, FIG. 5 shows a specific structure of another air-cooling radiator. A heat dissipation fin 12 and a housing 11 are an integrated structure. During preparation, the heat dissipation fin 12 is prepared together with the housing 11 through an extrusion forming process, and each heat dissipation fin 12 is a rectangular heat dissipation fin (or in another shape such as a rhombus or an oval), and a length direction of the heat dissipation fin 12 is a direction from an air inlet to an air outlet. When the integrated structure is used, a good heat conduction effect is achieved between the housing 11 and the heat dissipation fin 12.

When the foregoing housing and heat dissipation fin are used, the housing of the air-cooling radiator and the heat dissipation fin may be produced using a material with a good heat conductivity coefficient, for example, a common metal material such as aluminum or iron.

Still referring to FIG. 2 and FIG. 3B, to improve a heat dissipation effect of the air-cooling radiator, the air-cooling radiator further includes an air supply module 60, to increase an air flowing speed inside a heat dissipation channel. The air supply module 60 includes a first fan module 61 and a second fan module 62 that are arranged along a length direction of the heat dissipation channel. The first fan module 61 and the second fan module 62 are disposed on an air inlet a and an air outlet b of the heat dissipation channel in a one-to-one correspondence, and the first fan module 61 and the second fan module 62 have a same air supply direction, for example, an air flowing direction shown by an arrow in FIG. 3B. The air supply direction of the first fan module 61 and the second fan module 62 is the same as the air flowing direction. As shown in FIG. 3B, the first fan module 61 is configured to blow cold air from the outside into the heat dissipation channel, and the second fan module 62 is configured to draw air inside the heat dissipation channel to the outside. Through cooperation of the first fan module 61 and the second fan module 62, an air flowing speed inside the heat dissipation channel is improved, thereby improving heat dissipation efficiency of the air-cooling radiator.

An intelligent vehicle to which the in-vehicle computing apparatus is applied includes an in-vehicle power supply system, and the in-vehicle power supply system supplies power to the first fan module or the second fan module using at least one of two mainboards. For example, the first fan module 61 is electrically connected to one of the two mainboards, and the second fan module 62 is electrically connected to the other mainboard in the two mainboards. That the first fan module 61 is connected to the first mainboard 20 and the second fan module 62 is connected to the second mainboard 30 is used as an example to describe a relationship between the fan module and the mainboard. The first fan module 61 is electrically connected to the first mainboard 20, and when the first mainboard 20 is used as a mainboard in a working state, the in-vehicle power supply system supplies power to the first fan module 61 using the first mainboard 61, and the second fan module 62 is in a standby state. When the first mainboard 20 is faulty, the second mainboard 30 starts to work, the in-vehicle power supply system supplies power to the second fan module 62 using the second mainboard 30, and the first fan module 61 is in a standby state. It can be learned from the foregoing descriptions that, regardless of a specific faulty mainboard, it can be ensured that there is still a fan module that is in a working state, thereby ensuring the heat dissipation effect of the air-cooling radiator such that the first mainboard 20 or the second mainboard 30 can have a reliable heat dissipation effect.

In an implementable solution, the first fan module 61 may be electrically connected to the two mainboards, and the second fan module 62 is electrically connected to the two mainboards. In other words, the in-vehicle power supply system supplies power to the first fan module 61 using the first mainboard 20 and the second mainboard 30, and at the same time, supplies power to the second fan module 62 using the first mainboard 20 and the second mainboard 30. The first fan module 61 is used as an example. When the first mainboard 20 is in a working state, and the second mainboard 30 is used as a backup mainboard, the in-vehicle power supply system supplies power to the first fan module 61 using the first mainboard 20, and the first fan module 61 is in a working state. When the first mainboard 20 is faulty, and the second mainboard 30 starts to work, the in-vehicle power supply system works by supplying power to the first fan module 61 using the second mainboard 30. A working mode of the second fan module 62 is the same as a working mode of the first fan module 61. Therefore, details are not described herein. It can be learned from the foregoing descriptions that, when the first mainboard 20 or the second mainboard 30 is faulty, the first fan module 61 and the second fan module 62 can still work normally, thereby ensuring that the air-cooling radiator can still normally dissipate heat, and ensuring that the first mainboard 20 or the second mainboard 30 can still have a reliable heat dissipation effect. In addition, heat of the two mainboards is dissipated at the same time using a shared radiator, thereby reducing space occupied by the in-vehicle computing apparatus. A volume of approximately one in-vehicle computing apparatus in the other approaches is used, but an effect of two in-vehicle computing apparatuses in the other approaches can be achieved. In addition, the first fan module 61 and the second fan module 62 are each connected to the two mainboards such that it is ensured that at least one fan module is in a working state, thereby improving reliability of the air-cooling radiator, and also improving reliability of the in-vehicle computing apparatus.

Figure 6A:
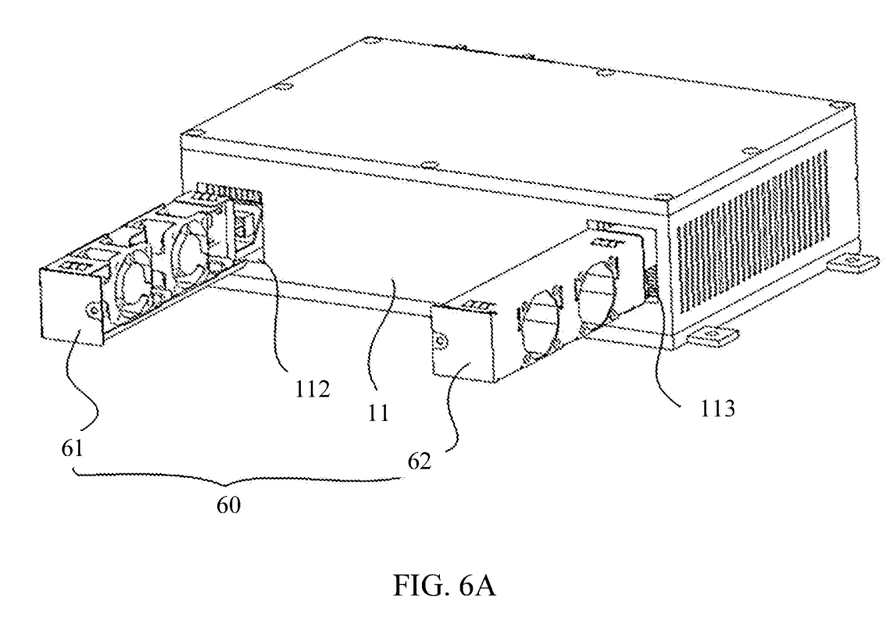
FIG. 6A is a schematic exploded diagram of a fan module and an air-cooling radiator according to this application.
Figure 6B:
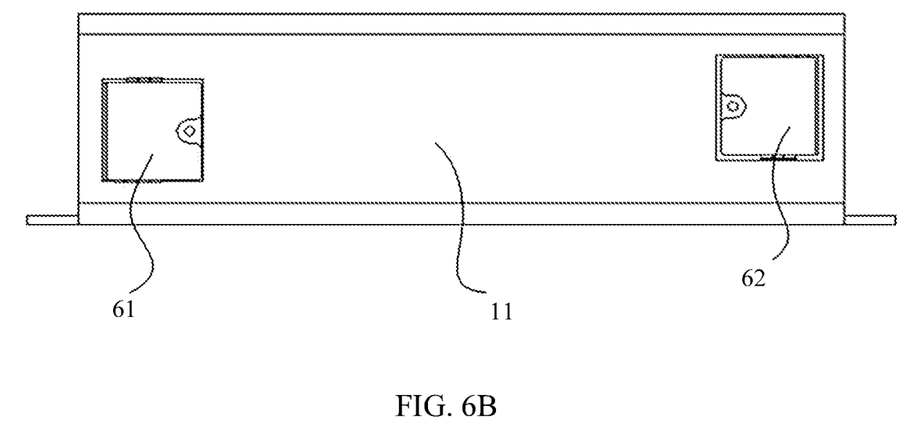
FIG. 6B is a schematic assembling diagram of a fan module and an air-cooling radiator according to this application.

As shown in FIG. 6A and FIG. 6B, FIG. 6A is a schematic exploded diagram of a fan module and an air-cooling radiator, and FIG. 6B is a schematic assembling diagram of a fan module and an air-cooling radiator. For same reference numerals in FIG. 6A and FIG. 6B, refer to FIG. 2 and FIG. 3B. The first fan module 61 and the second fan module 62 are each connected to the air-cooling radiator in a detachable connection manner. The first fan module 61 is used as an example below to describe a connection manner between the fan module and the air-cooling radiator.

Still referring to FIG. 6A and FIG. 6B, the first fan module 61 is detachably and fixedly connected to the housing 11 of the air-cooling radiator. A first jack 112 cooperating with the first fan module 61 is disposed on the housing 11 of the air-cooling radiator. The first jack 112 is provided on a side wall (not shown in the figure) of the housing 11, and a length direction of the first jack 112 is perpendicular to a length direction of a heat dissipation channel. Referring to FIG. 3B, when the first fan module 61 is inserted into the first jack 112, a length direction of the first fan module 61 is perpendicular to the length direction of the heat dissipation channel 13, and an air supply direction of the first fan module 61 is the same as the length direction of the heat dissipation channel 13. Still referring to FIG. 6B, the first fan module 61 is fastened to the side wall of the housing 11 with a threaded connecting piece (such as a bolt or a screw), for example, the first fan module 61 is fixedly connected to the side wall of the housing 11 with the screw. When maintenance is required, the screw may be removed, and the first fan module 61 is directly plugged out.

Figure 7:
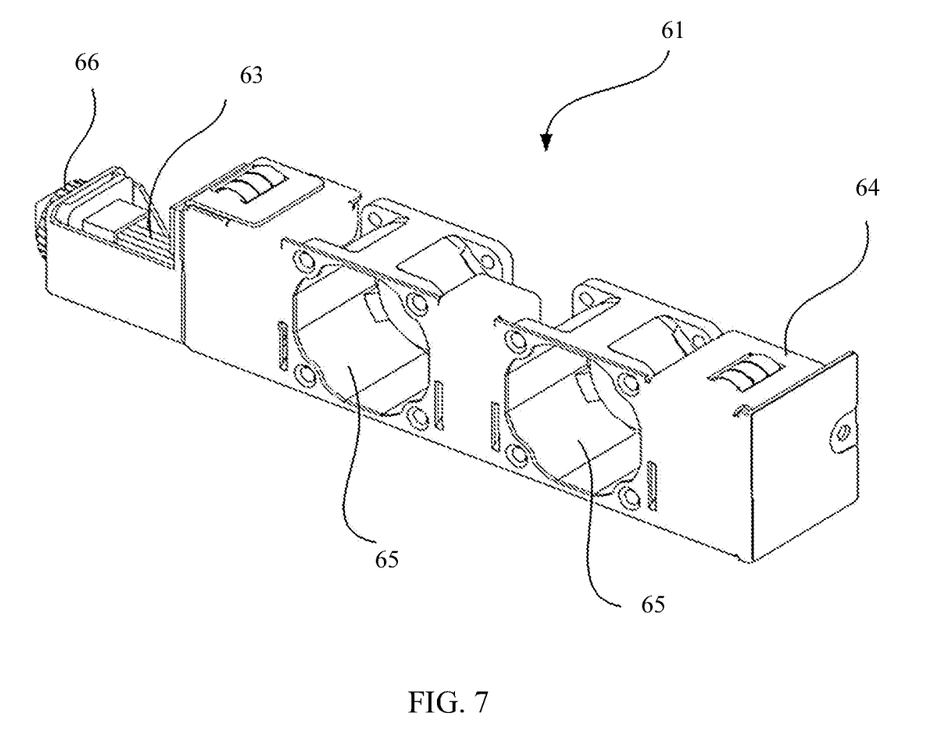
FIG. 7 is a schematic structural diagram of a first fan module according to this application.

Referring to FIG. 7, FIG. 7 shows a structure of the first fan module 61. The first fan module 61 includes a bracket 64 and at least one mounting hole 65 disposed on the bracket 64, and a fan is fastened inside each mounting hole 65 with a connecting piece, for example, the fan is fastened inside a corresponding mounting hole 65 with a bolt, a screw, or a fastener. In the structure shown in FIG. 7, two mounting holes 65 are disposed on the bracket 64, and the two mounting holes 65 are arranged along a length direction of the bracket 64. Referring to FIG. 3B, when the first fan module 61 is assembled to the air-cooling radiator, an arrangement direction of fans is perpendicular to the length direction of the heat dissipation channel. Still referring to FIG. 7, a cable 63 connected to each fan and a connection terminal 66 configured to connect to the first mainboard or the second mainboard are further disposed on the bracket 64. The connection terminal 66 is electrically connected to each fan with the cable 63, and when the first fan module 61 is inserted into the first jack, the connection terminal 66 is electrically connected to the first mainboard or the second mainboard, or is electrically connected to both the first mainboard and the second mainboard. A manner in which the first fan module 61 is connected to the first mainboard with the connection terminal 66 is a common connection manner in the other approaches, and details are not described herein.

When the second fan module 62 is assembled, a corresponding second jack 113 is disposed on the housing 11. A manner of cooperation between the second fan module 62 and the second jack 113 is the same as the foregoing manner of cooperation between the first fan module 61 and the first jack 112, and details are not described herein again. For a structure of the second fan module 62, refer to the foregoing descriptions of the structure of the first fan module 61.

Figure 8:
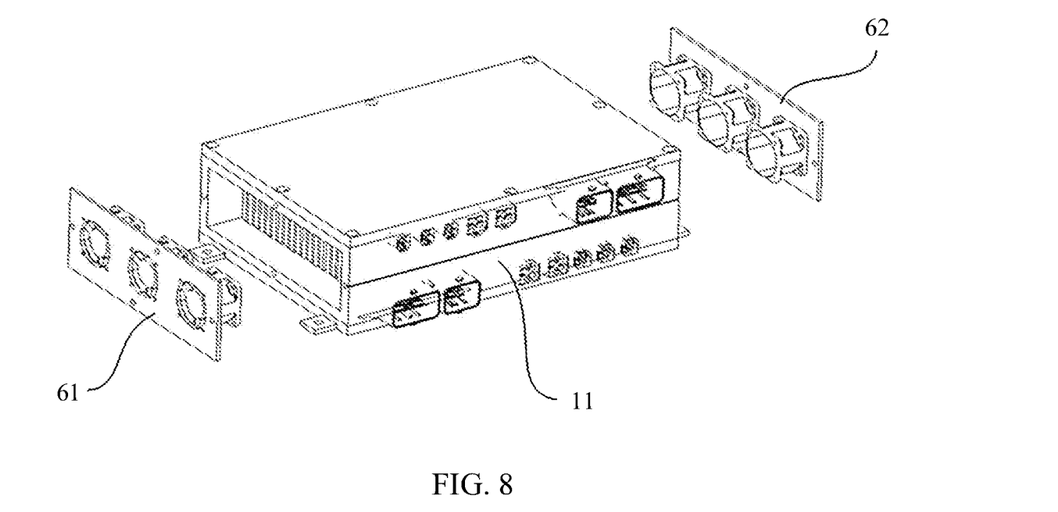
FIG. 8 is a schematic exploded diagram of a cooperation manner of another fan module and an air-cooling radiator according to this application.

In a possible implementation, FIG. 8 shows another cooperation manner between the fan module and the air-cooling radiator. As shown in the figure, the first fan module 61 and the second fan module 62 are respectively located on two ends of the housing 11 of the air-cooling radiator, there are two openings on the two ends of the housing 11 of the air-cooling radiator, and the two openings respectively correspond to the air inlet and the air outlet of the heat dissipation channel. When the first fan module 61 and the second fan module 62 are assembled, the first fan module 61 covers the air inlet of the heat dissipation channel, and the first fan module 61 is fixedly connected to the housing 11 with a threaded connecting piece (such as a bolt or a screw), and the second fan module 62 covers the air outlet of the heat dissipation channel, and the second fan module 62 is fixedly connected to the housing 11 with a threaded connecting piece (a bolt or a screw). When the connection manner shown in FIG. 7 is used, the fan module is easy to assemble, and directly covers the housing 11 for fastening, thereby reducing an assembly error.

Figure 9:
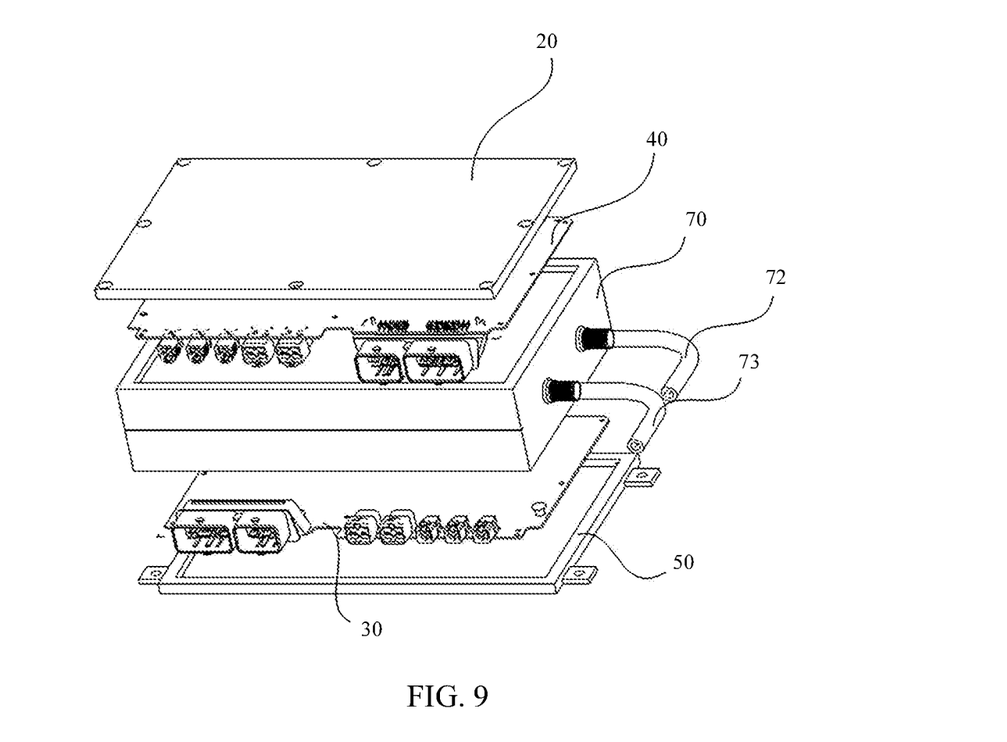
FIG. 9 is a schematic exploded diagram of a second in-vehicle computing apparatus according to this application.
Figure 10A:
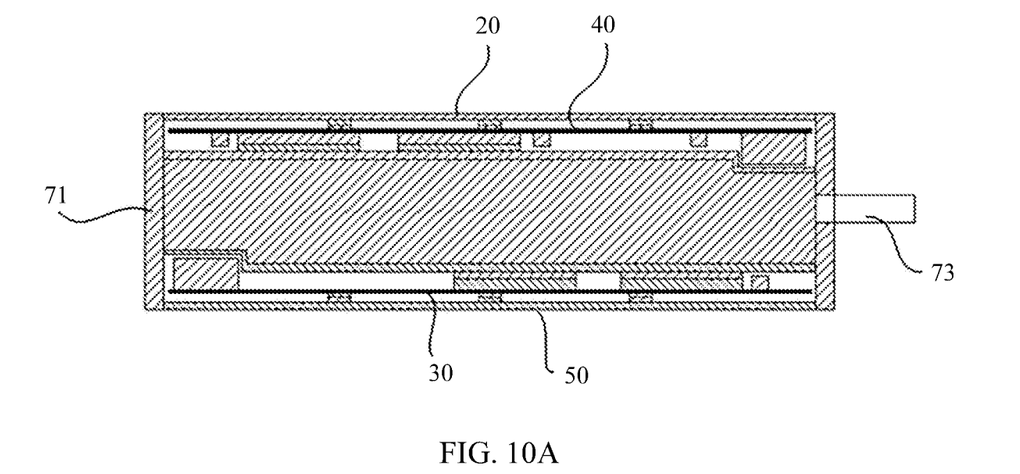
FIG. 10A is a sectional view of a second in-vehicle computing apparatus in a vertical direction.
Figure 10B:
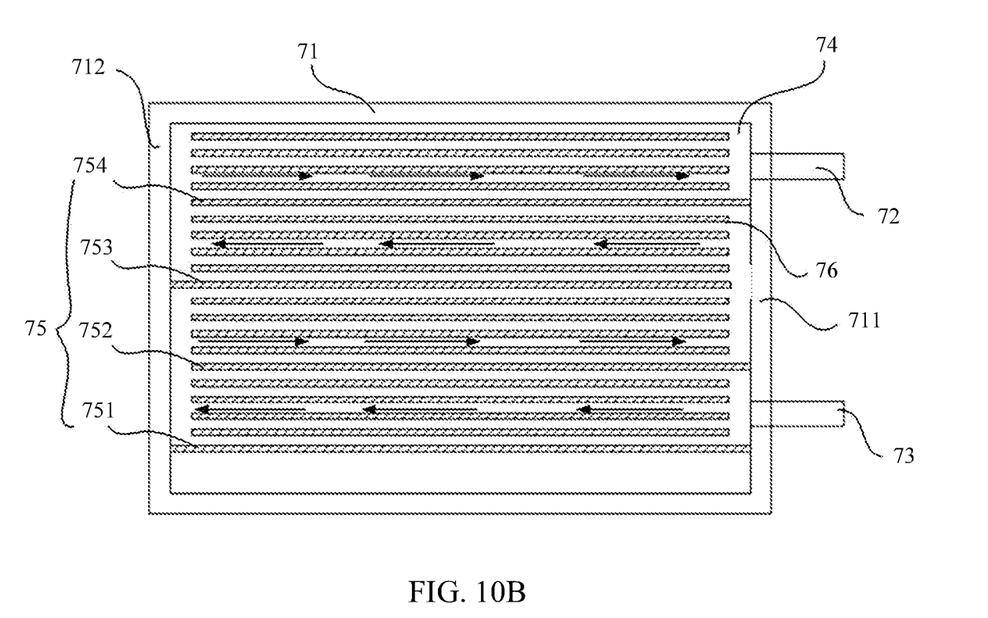
FIG. 10B is a sectional view of a second in-vehicle computing apparatus in a horizontal direction.

In another possible implementation, FIG. 9 is a schematic exploded diagram of a second in-vehicle computing apparatus according to an embodiment of this application. For a same reference numeral in FIG. 9, refer to the reference numeral in FIG. 2. A difference from FIG. 1 to FIG. 8 lies in that a radiator of the in-vehicle computing apparatus provided in FIG. 9 is a liquid-cooling radiator 70. Referring to FIG. 10A and FIG. 10B, FIG. 10A is a sectional view of the second in-vehicle computing apparatus in a vertical direction, and FIG. 10B is a sectional view of the second in-vehicle computing apparatus in a horizontal direction. The liquid-cooling radiator 70 includes a housing 71 and a heat dissipation pipe 74 disposed inside the housing 71, and two opposite surfaces of the housing 71 are one-to-one connected to a first mainboard 20 and a second mainboard 30 in a thermally conductive manner. A disposing manner of the heat dissipation pipe 74 is shown in FIG. 10B. The heat dissipation pipe 74 is laid inside the housing 71 in a horizontal direction (using a placement direction of the liquid-cooling radiator in FIG. 10B as a reference direction), and the laid heat dissipation pipe 74 is coiled into an S-shaped heat dissipation pipe, and two ends of the heat dissipation pipe 74 are respectively connected to a water inlet 73 and a water outlet 72 disposed on the housing 71.

Still referring to FIG. 10B, a plurality of first heat dissipation fins 75 arranged at intervals are disposed inside the housing 71, each first heat dissipation fin 75 has a first length, the first length is less than a width of the housing 71, one end of each first fin 75 is connected to one side wall of the housing, and two adjacent first fins are connected to different side walls of the housing such that a connected "S"-type heat dissipation pipe is formed between the plurality of first heat dissipation fins 75. In FIG. 10B, there are four first heat dissipation fins 75, the four first heat dissipation fins are respectively a first heat dissipation fin 751, a first heat dissipation fin 752, a first heat dissipation fin 753, and a first heat dissipation fin 754, and the four first heat dissipation fins are arranged along an arrangement direction of the water inlet 73 and the water outlet 72. The plurality of first heat dissipation fins 75 separate the housing into a plurality of areas. For ease of describing a disposing manner of the first heat dissipation fins 75, two opposite first side wall 711 and second side wall 712 of the housing 71 are first defined. The first side wall 711 is a side wall on which the water inlet 73 is disposed, and the second side wall 712 is another side wall opposite to the first side wall 711. Two ends of the first heat dissipation fin 751 are respectively connected to the first side wall 711 and the second side wall 712 in a sealing manner. The first heat dissipation fin 752 is connected to the first side wall 711 in a sealing manner. The first heat dissipation fin 753 is connected to the second side wall 712 in a sealing manner. The first heat dissipation fin 754 is connected to the first side wall 711 in a sealing manner. In addition, the first heat dissipation fin 754 and a side wall (a side wall between the first side wall 711 and the second side wall 712) of the housing 71 form a part that is of the heat dissipation pipe 74 and that is connected to the water outlet 72. It can be learned from the foregoing descriptions that the first heat dissipation fins 752, 753, and 754 that are located in the middle are alternately connected to the first side wall 711 and the second side wall 712 in a sealing manner, to form a connected S-shaped heat dissipation pipe 74. There are m (m is a positive integer and is greater than 2) first heat dissipation fins 75, and m−1 bent S-shaped heat dissipation pipes may be formed. The S-shaped heat dissipation pipe increases fluidity of the liquid medium inside the housing, and improves a heat dissipation effect of the radiator. As shown by a flowing direction of the liquid medium shown by an arrow in FIG. 10B, the liquid medium flows into the heat dissipation pipe 74 from the water inlet 73, and then flows out through the water outlet 72. In a flowing process, the liquid medium takes away heat transferred by the first mainboard or the second mainboard to the housing 71. The liquid medium may be a common medium such as oil or water.

It should be understood that FIG. 10B only schematically shows a disposing position of the heat dissipation pipe 74, and does not represent an actual shape of the heat dissipation pipe 74.

Still referring to FIG. 10B, to improve a heat dissipation effect of the liquid-cooling radiator, a plurality of second heat dissipation fins are disposed between any adjacent first heat dissipation fins, the plurality of second heat dissipation fins are arranged at intervals, the second heat dissipation fin has a second length, the second length is less than the first length, and each second heat dissipation fin is not in contact with a side wall of the housing such that a plurality of channels are formed between two adjacent first heat dissipation fins, liquid can flow inside the housing, and heat of components on the first mainboard and/or the second mainboard is conducted to the outside of the radiator, thereby dissipating heat for the computing apparatus. For example, four second heat dissipation fins 76 are disposed between the first heat dissipation fin 751 and the first heat dissipation fin 752, and an arrangement direction of the second heat dissipation fins 76 is the same as an arrangement direction of the first heat dissipation fins 75. In addition, two ends of each second heat dissipation fin 76 are not sealed with the first side wall 711 and the second side wall 712, and a gap of a specific distance is reserved between the second heat dissipation fin and the side walls such that the liquid medium can flow through. During use, heat transferred to the housing 71 is transferred to the first heat dissipation fin 75 and the second heat dissipation fin 76. When the liquid medium flows inside the liquid pipe 74, the liquid medium is separately in contact with the first heat dissipation fin 75 and the second heat dissipation fin 76, thereby increasing a contact area between the liquid medium and the housing 71, and further improving a heat dissipation effect of the liquid medium.

When the liquid-cooling radiator is used, the intelligent vehicle has a cooling system, and the cooling system is configured to control the liquid-cooling radiator. Further, the cooling system provides flowing power for the liquid medium in the liquid-cooling radiator. The liquid medium is pumped into the heat dissipation pipe using a pump in the cooling system, and the liquid medium is driven to flow inside the heat dissipation pipe such that the liquid medium dissipates heat for two chips in the heat dissipation pipe. In addition, the liquid medium flowing through the liquid radiator is cooled by the cooling system and then enters the liquid radiator again, to form a circulation loop to continuously dissipate heat for the first mainboard and the second mainboard.

When the cooling system pumps the liquid medium into the heat dissipation pipe, a volume of a liquid medium that is pumped into the heat dissipation pipe at a single time in the cooling system is greater than or equal to a volume of a liquid medium that is accommodated between two adjacent first fins such that a liquid medium pumped each time can fill a gap between the two first heat dissipation fins, to prevent a liquid medium with high temperature from remaining between the two first heat dissipation fins, and ensure fluidity of the liquid medium inside the heat dissipation pipe.

Optionally, when the plurality of first heat dissipation fins 75 separate the housing into a plurality of areas of a same size, a volume of a liquid medium that is pumped into the heat dissipation pipe at a single time in the cooling system is greater than or equal to a volume of liquid that can be accommodated in any area such that a liquid medium pumped each time can fill space of one area. Under the action of power, the liquid medium can flow inside the housing, and heat conducted by a liquid medium of the chip is taken out of the housing, and the cooling system completes cooling of the liquid medium, thereby ensuring that the liquid radiator effectively dissipates heat for a component on the mainboard.

An embodiment of this application further provides an intelligent vehicle. The intelligent vehicle may be a new energy vehicle or a vehicle using gasoline as energy. However, regardless of a used vehicle, the intelligent vehicle includes an intelligent vehicle body and an automated driving system disposed inside the intelligent vehicle body, and the automated driving system includes the foregoing in-vehicle computing apparatus.

When the in-vehicle computing apparatus is disposed, due to a dustproof/waterproof requirement, the in-vehicle computing apparatus is disposed on one end inside the vehicle body, for example, a head position or a tail position of the vehicle, or inside a passenger compartment.

Figure 11:
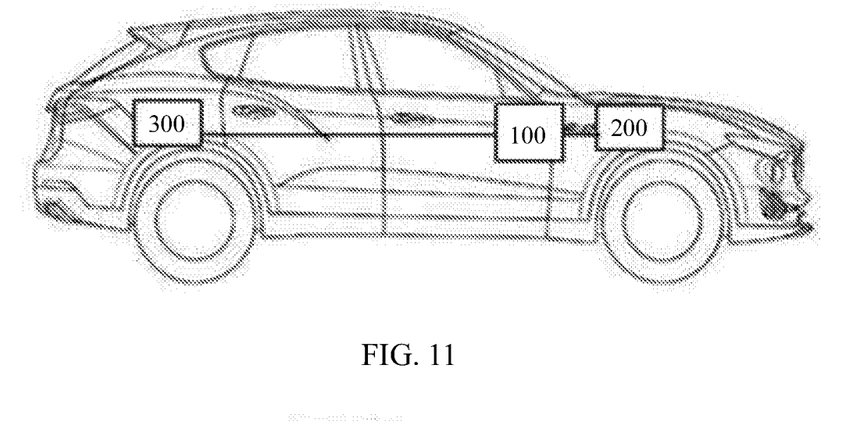
FIG. 11 is a schematic diagram of an intelligent vehicle according to this application.

FIG. 11 is a schematic diagram of an intelligent vehicle. The intelligent vehicle includes a power supply system 300, and the power supply system 300 is electrically connected to a first mainboard and a second mainboard of an in-vehicle computing apparatus 100, and is electrically connected to a first fan module and a second fan module using the first mainboard or the second mainboard. During use, the power supply system 300 supplies power to the first mainboard, the second mainboard, the first fan module, and the second fan module, and the first fan module and the second fan module improve air fluidity inside a radiator, thereby improving heat dissipation effects for the first mainboard and the second mainboard. In addition, the intelligent vehicle further includes a cooling system 200. The cooling system 200 is an air conditioning system inside the intelligent vehicle. An air outlet of the air conditioning system is connected to a heat dissipation channel of the radiator, and cold air blown out by the air conditioning system may enter the heat dissipation channel to dissipate heat for the first mainboard and the second mainboard.

Figure 12:
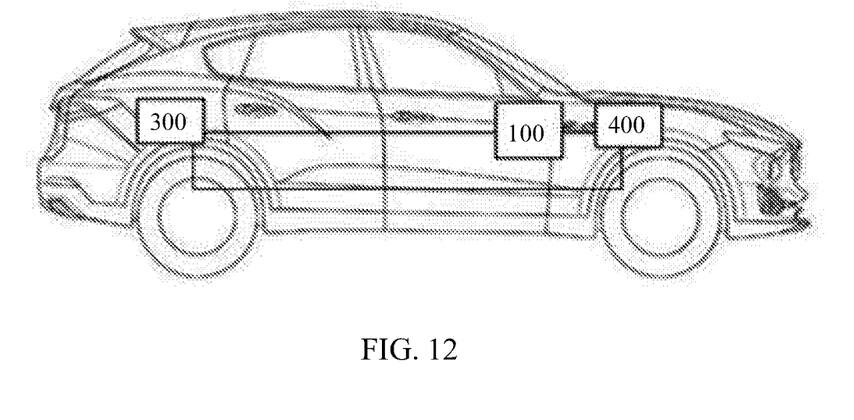
FIG. 12 is a schematic diagram of another intelligent vehicle according to this application.

FIG. 12 is a schematic diagram of another internal structure of an intelligent vehicle. A cooling system 400 is disposed inside the intelligent vehicle body. The cooling system 400 includes a condenser, a cooling plate connected to the condenser through a pipe, and the foregoing radiator. The radiator is a liquid-cooling radiator. In addition, the intelligent vehicle further includes a power supply system 300. The power supply system 300 supplies power to the in-vehicle computing apparatus 100. For a specific power supply manner, refer to corresponding descriptions in FIG. 12. In addition, the cooling system 400 is further configured to cool the power supply system 300.

Figure 13:
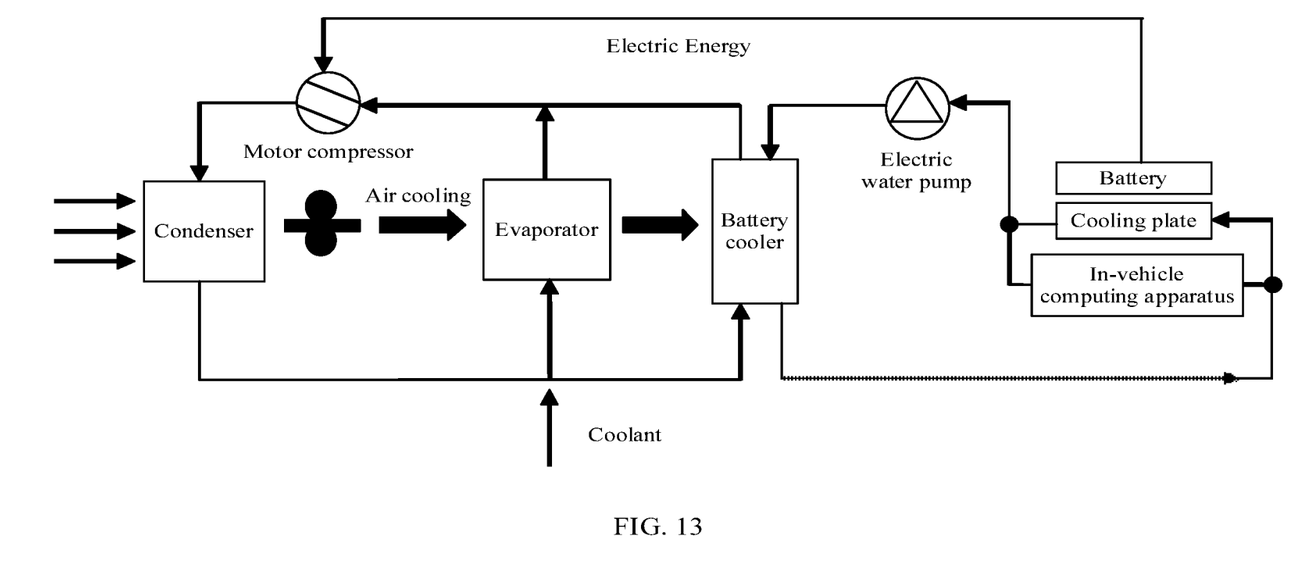
FIG. 13 is a specific schematic diagram of a cooling system according to this application.

FIG. 13 shows a specific cooling system structure. During specific heat dissipation, the intelligent vehicle forms an independent cooling system using cooling liquid (a mixture of glycol, water, and the like) as a medium to cool a battery group, and the cooling system includes parts such as a liquid pump (such as a water pump), an electric expansion valve (or a magnetic valve and a thermostatic expansion valve), a cooling plate (also referred to as a water cooling plate), and a condenser. An electric water pump may be used as the water pump, and the water pump is used as a driving part and circularly supplies a power source to the cooling liquid. As a control part, the electric expansion valve (not shown in the figure) may actively adjust flow of the cooling system based on intensity of pressure and temperature of the cooling system. The cooling plate is configured to dissipate heat for a battery, and the radiator in the in-vehicle computing apparatus dissipates heat for the first mainboard and the second mainboard. During use, cooling liquid flowing through the electric magnetic valve is separately supplied to the cooling plate and the radiator, and the cooling plate and the radiator separately dissipate heat for the battery, the first mainboard, and the second mainboard. The cooling liquid on which heat exchanging is performed flows into a battery cooler. The battery cooler is used as a heat exchanging component, and the battery cooler exchanges heat with the air conditioning system through a pipe. The air conditioning system includes components such as a condenser, an evaporator, a motor compressor, and an expansion valve. A structure of the air conditioning system is a system of an in-vehicle air conditioner in the other approaches. Details are not described herein. The battery cooler is connected in parallel with the evaporator in the air conditioning system, provides a cooled medium using the condenser, and exchanges heat in the battery cooler with the cooling liquid on which heat exchanging is performed. In the foregoing cooling system, an original cooling system inside the intelligent vehicle and the air conditioning system are used to dissipate heat for the radiator. Compared with the air-cooling radiator, lower costs are consumed, and a cooling effect is better than air cooling.

FIG. 13 shows an example in addition to a disposing manner in which the in-vehicle computing apparatus and the cooling plate parallel are connected in parallel, but a specific connection manner of the in-vehicle computing apparatus and the cooling plate is not limited in this embodiment of this application, and a manner of connection in series may also be used. In both manners, a heat dissipation effect can be achieved for the first mainboard and the second mainboard.

It is clear that, a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. An in-vehicle computing apparatus in an intelligent vehicle comprising:
    two mainboards that are stacked, wherein each of the two mainboards comprises a plurality of components that are configured to perform driving status control on the intelligent vehicle;
    a radiator disposed between the two mainboards and coupled to each of the two mainboards in a thermally conductive manner, wherein the radiator is an air-cooling radiator comprising:
        a housing, wherein a first jack and a second jack are disposed directly on the housing;
        a heat dissipation channel disposed on the housing; and
        an air supply system comprising:
            a first fan system comprising a first air supply direction; and a second fan system comprising the first air supply direction,
wherein the first fan system and the second fan system are arranged along a length direction of the heat dissipation channel, wherein each of the first fan system and the second fan system is detachably or fixedly coupled to the housing, wherein the first fan system is detachably fastened to the first jack, and wherein the second fan system is detachably fastened to the second jack; and
two sealing plates, wherein each of the two sealing plates is disposed on a side of each of the two mainboards and faces away from the radiator.

2. The in-vehicle computing apparatus of claim 1, wherein the intelligent vehicle comprises an in-vehicle power supply system, wherein the first fan system or the second fan system is configured to receive, from the in-vehicle power supply system, power through at least one of the two mainboards, and wherein either:
the first fan system is electrically coupled to a first mainboard of the two mainboards, and the second fan system is electrically coupled to a second mainboard of the two mainboards; or
the first fan system is electrically coupled to the two mainboards, and the second fan system is electrically coupled to the two mainboards.

3. The in-vehicle computing apparatus of claim 1, wherein a plurality of heat dissipation fins is disposed inside the housing to form the heat dissipation channel among the plurality of heat dissipation fins.

4. The in-vehicle computing apparatus of claim 1, wherein the heat dissipation channel is a straight channel, and wherein the length direction of the heat dissipation channel is perpendicular to a stacking direction of the two mainboards.

5. The in-vehicle computing apparatus of claim 4, wherein the first fan system is configured to blow first air outside the radiator into the heat dissipation channel, and wherein the second fan system is configured to draw second air inside the heat dissipation channel out of the radiator.

6. The in-vehicle computing apparatus of claim 1, wherein each of the two mainboards comprises a first surface facing the radiator, wherein a first functional component is disposed on the first surface of each of the two mainboards, and wherein the first functional component is coupled to the radiator in a thermally conductive manner.

7. The in-vehicle computing apparatus of claim 1, wherein each of the two mainboards comprises a second surface facing away from the radiator, wherein a second functional component is disposed on the second surface of each of the two mainboards, wherein each of the two sealing plates corresponding to each of the two mainboards is a heat dissipation plate, and wherein each second functional component of each of the two mainboards is coupled to the heat dissipation plate in a thermally conductive manner.

8. The in-vehicle computing apparatus of claim 1, wherein the intelligent vehicle comprises an in-vehicle power supply system.

9. The in-vehicle computing apparatus of claim 1, wherein the heat dissipation channel is a straight channel.

10. The in-vehicle computing apparatus of claim 1, wherein the first fan system is configured to blow first air outside the radiator into the heat dissipation channel of the housing.

11. The in-vehicle computing apparatus of claim 1, wherein the second fan system is configured to draw second air inside the heat dissipation channel of the housing out of the radiator.

12. An intelligent vehicle comprising:
an intelligent vehicle body; and
an in-vehicle computing apparatus comprising:
two mainboards that are stacked, wherein each of the two mainboards comprises a plurality of components that are configured to perform driving status control on the intelligent vehicle;
a radiator that is disposed between the two mainboards and coupled to each of the two mainboards in a thermally conductive manner, wherein the radiator is an air-cooling radiator comprising:
a housing, wherein a first jack and a second jack are disposed directly on the housing;
a heat dissipation channel disposed on the housing; and
an air supply system comprising:
a first fan system comprising a first air supply direction; and
a second fan system comprising the first air supply direction,
wherein the first fan system and the second fan system are arranged along a length direction of the heat dissipation channel, wherein each of the first fan system and the second fan system is detachably or fixedly coupled to the housing, the first fan system is detachably fastened to the first jack, and the second fan system is detachably fastened to the second jack; and
two sealing plates, wherein each of the two sealing plates is disposed on a side of each of the two mainboards and faces away from the radiator.

* * * * *